(12) United States Patent
Patz et al.

(10) Patent No.: US 8,143,138 B2
(45) Date of Patent: Mar. 27, 2012

(54) METHOD FOR FABRICATING INTERCONNECT STRUCTURES FOR SEMICONDUCTOR DEVICES

(75) Inventors: Ryan James Patz, Albany, NY (US); Igor Peidous, Fishkill, NY (US); Jeremiah Pender, San Jose, CA (US); Michael D. Armacost, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 445 days.

(21) Appl. No.: 12/240,061

(22) Filed: Sep. 29, 2008

(65) Prior Publication Data

US 2010/0078825 A1  Apr. 1, 2010

(51) Int. Cl.
*H01L 21/76* (2006.01)
(52) U.S. Cl. ................ 438/435; 438/430; 257/E21.021
(58) Field of Classification Search .................. 438/643, 438/430, 435
See application file for complete search history.

(56) References Cited

U.S. PATENT DOCUMENTS

| | | | | |
|---|---|---|---|---|
| 6,562,715 | B1 * | 5/2003 | Chen et al. | 438/643 |
| 7,071,100 | B2 * | 7/2006 | Chen et al. | 438/643 |
| 7,416,992 | B2 * | 8/2008 | Lehr et al. | 438/723 |
| 7,811,929 | B2 * | 10/2010 | Lee et al. | 438/637 |
| 2006/0194430 | A1 * | 8/2006 | Beck | 438/627 |
| 2007/0205482 | A1 * | 9/2007 | Yang et al. | 257/499 |

* cited by examiner

*Primary Examiner* — Matthew C Landau
*Assistant Examiner* — Sonya D McCall Shepard
(74) *Attorney, Agent, or Firm* — Blakely, Sokoloff, Taylor & Zafman LLP

(57) ABSTRACT

Described herein are methods for fabricating dual-damascene interconnect structures. In one embodiment, the interconnect structures are fabricated with a dual-damascene method having trenches then vias formed. The method includes novel liner depositions after the trench and via etches. The method includes etching trenches in a dielectric layer. Next, the method includes depositing a first liner layer on the dielectric layer. Next, the method includes etching vias in the dielectric layer and an etch stop layer. Next, the method includes depositing a second liner layer on the first liner layer. The second liner layer is deposited on the exposed surfaces of the first liner layer, dielectric layer, etch stop layer, and the first metal layer. Then, a second metal layer is deposited on the second liner layer.

6 Claims, 8 Drawing Sheets

METHOD FOR FABRICATING INTERCONNECT STRUCTURES FOR SEMICONDUCTOR DEVICES

TECHNICAL FIELD

Embodiments of the present invention relate to fabricating dual-damascene interconnect structures for semiconductor devices.

BACKGROUND

As semiconductor manufacturing technology advances to smaller and smaller feature sizes, porous low dielectric constant (low-k) integration with Copper interconnect technology has been widely evaluated. Interconnect delay becomes a significant performance barrier for high-speed signal conduction. The use of dielectric materials with a lower dielectric constant can significantly improve performance measures by reducing signal propagation time delay, cross talk, and power consumption in semiconductor devices having a multilevel interconnect architecture. The most-used dielectric material for semiconductor fabrication has been silicon oxide ($SiO_2$), which has a dielectric constant in the range of k=3.9 to 4.5, depending on its method of formation. Dielectric materials with k less than 3.9 are classified as low-k dielectrics. Some low-k dielectrics are organosilicates formed by doping silicon oxide with carbon-containing compounds.

A dual-damascene interconnect structure requires only a single metal deposition step to simultaneously form metal lines and metal in vias. In other words, both trenches and vias are formed in a single dielectric layer. The vias and trenches are formed by using two lithography operations. A via then trench prior approach for fabricating dual-damascene interconnect structures is illustrated in FIGS. 1A, 1B, and 1C. In FIG. 1A, a via masking layer is disposed on a hard mask layer, which is disposed on a low-k dielectric layer, which is disposed on a etch stop layer, which is disposed partially on an oxide layer and partially on a Copper metal layer. Vias are etched in the openings of the via masking layer and then filled with an organic planarizing layer. The trench hard mask layer is then deposited followed by trench lithography as illustrated in FIG. 1B. Trenches are then etched followed by strip operations resulting in the interconnect structure illustrated in FIG. 1C. The vias and trenches are then filled with metal.

This prior approach for forming dual-damascene interconnect structures has various problems. The via etch has a high aspect ratio making this a difficult etch in terms of obtaining vertical sidewalls and uniform via size across a wafer in a repeatable manner for a manufacturing process. After the via etch and strip, the vias are exposed to several etch processes including the trench etch, an organic planarizing layer strip, and a etch stop layer etch. These subsequent etches can alter the shape of profile of the vias. Also, the low-k dielectric layer that forms the via sidewalls is modified with a resulting increase in the dielectric constant and increase in interconnect delay. During the trench etch, the corners of the vias are exposed and rounded. This negatively impacts the via contact resistance and interconnect delay within a die as well as across wafer uniformity. The etch stop layer needs to be thick enough to provide barrier properties such as prevent Copper diffusion from the metal layer into the low-k dielectric layer and also preventing Copper oxidation. The etch stop layer has a dielectric constant greater than the low-k dielectric layer and thus increases the effective dielectric constant of the film layers in combination.

FIG. 2 illustrates an example of a low quality etch front including pitting/voiding, surface roughness, and microtrenching near the edges of features. The mechanism of these defects may relate to the trench etch being performed simultaneously with the organic layer etch as illustrated in FIGS. 1B and 1C.

In a trench-first prior approach, the trench patterns are defined in a interlayer dielectric first. That is, after spinning on the resist, the trench-pattern-mask is used to expose the resist. The trench is then produced by etching the dielectric down to the embedded etch-stop layer. After the trench-etching process, the first resist layer is stripped. A second resist layer is then spun on, and the via-pattern-mask, which is aligned to the trench that was previously etech, is used to create openings in this resist layer. The resist protects the other parts of the wafer surface (including the etched regions of the trenches) so that the vias can be etched without further etching the dielectric in the trenches.

However, this prior approach of the trench-first sequence suffers from the fact that the vias must be patterned after the trench etch. That is, since resist is applied as a liquid onto the wafer surface, it fills recessed regions first. Hence, the top surface of the resist is planar. This means that the regions of resist over the damascene trenches are quite thick. Resolving fine features in thick resist is harder than in thinner resists. For smaller features the process latitude becomes too small for this to be a practical manufacturing process.

SUMMARY

Described herein are methods for fabricating dual-damascene interconnect structures. In one embodiment, a method of fabricating a dual-damascene interconnect structure includes etching trenches in a dielectric layer. Next, the method includes depositing a first liner layer on the dielectric layer. Next, the method includes etching vias in the dielectric layer and an etch stop layer. Next, the method includes depositing a second liner layer on the first liner layer. The second liner layer is deposited on the exposed surfaces of the first liner layer, dielectric layer, etch stop layer, and the first metal layer. Then, a second metal layer is deposited on the second liner layer.

The method includes novel liner depositions after the trench and via etches. The liner deposition after the trench etch and prior to via lithography protects the low-k dielectric layer from the via photoresist organic layer operation, moisture, plasma exposure during etch/resist removal, etc. The liner deposition also is used as a hard mask for the via etch to improve uniformity and profile of the vias without needing an additional hard mask layer and strip operation. The liner deposition after the via etch provides a barrier between the metal layers and other materials such as one or more low-k dielectric layers.

BRIEF DESCRIPTION OF THE DRAWINGS

Embodiments of the present invention are illustrated by way of example, and not by way of limitation, in the figures of the accompanying drawings and in which.

DETAILED DESCRIPTION

Figure 1A:
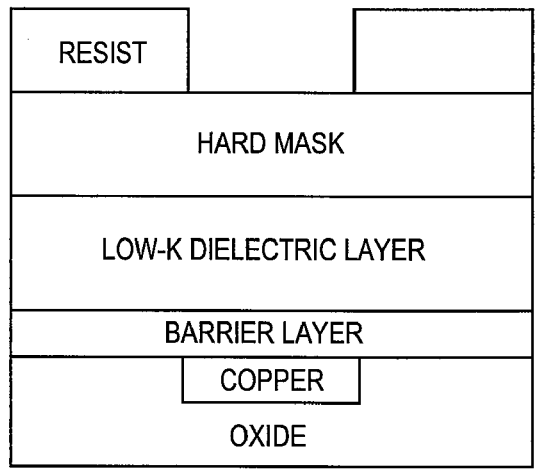
FIGS. 1A, 1B, and 1C illustrate cross-sectional views of a dual-damascene interconnect structure in accordance with a via then trench prior approach.
Figure 1B:
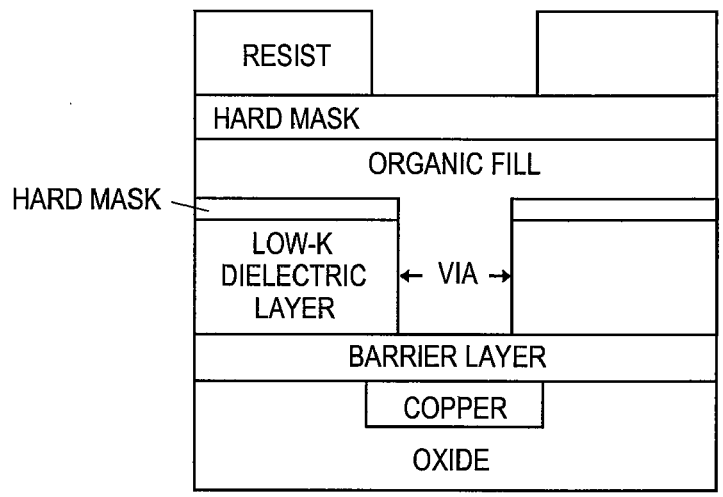
Figure 1C:
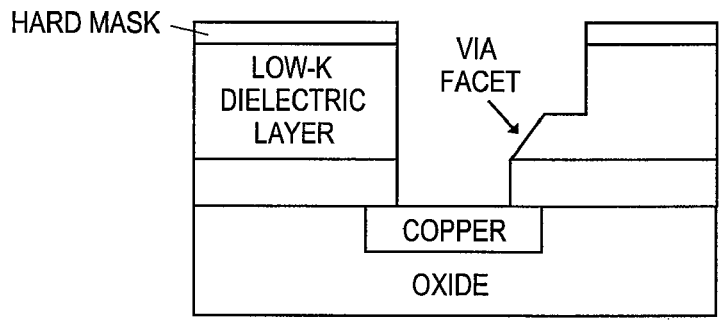
Figure 2:
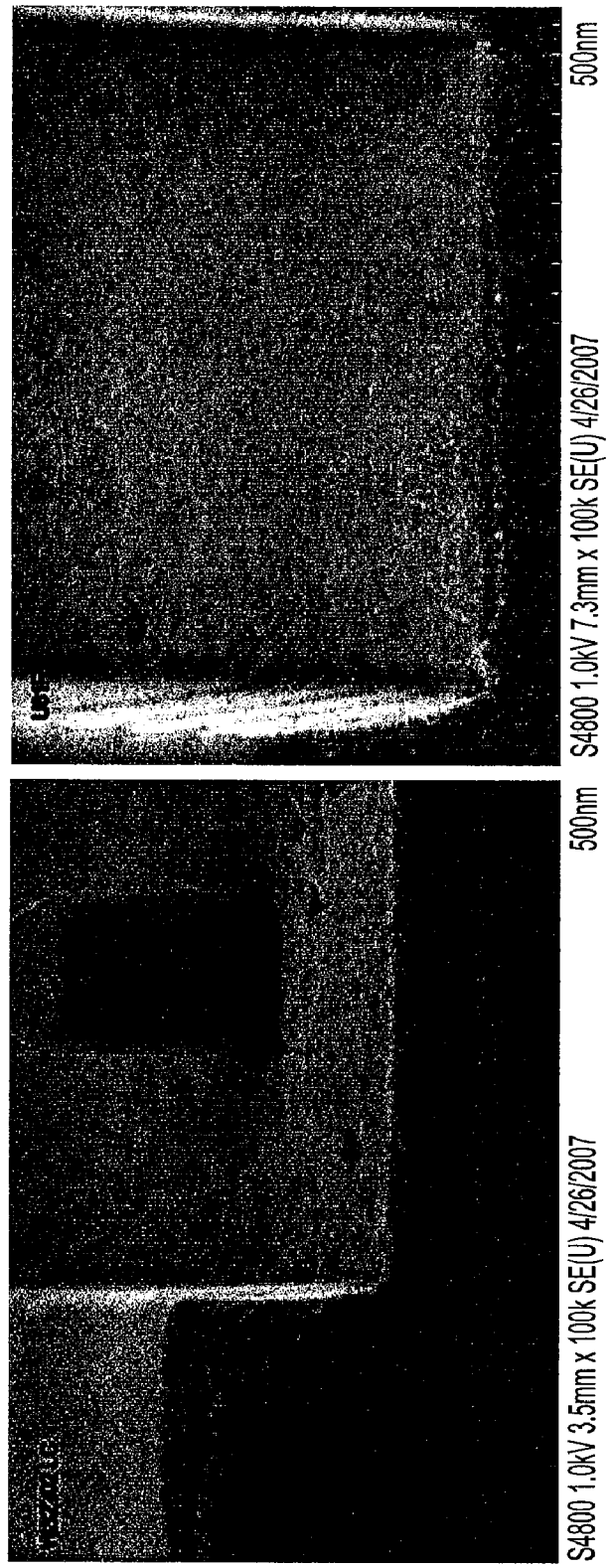
FIG. 2 illustrates an example of a low quality etch front including pitting/voiding, surface roughness, and microtrenching near the edges of features in accordance with the via then trench prior approach.

Described herein are exemplary methods for fabricating interconnect structures. In some embodiments, the interconnect structures described herein illustrate a dual-damascene process flow having trenches then vias formed from semiconductor deposition, lithography, etch, strip, and planarization operations. Dual-damascene forms studs and interconnects with one metallization operation. In another embodiment, the interconnect structures are a single damascene structure or other structure that forms an opening in a porous dielectric layer. For example, although embodiments discussed herein are related to fabricating dual damascene structures, it is to be understood that the methods are similarly applicable to fabricating other structures.

In one embodiment, a method of fabricating a dual-damascene interconnect structure includes etching trenches in a dielectric layer. Next, the method includes depositing a first liner layer on the dielectric layer. Next, the method includes etching vias in the dielectric layer and an etch stop layer. Next, the method includes depositing a second liner layer on the first liner layer. The second liner layer is deposited on the exposed surfaces of the first liner layer, dielectric layer, etch stop layer, and the first metal layer. Then, a second metal layer is deposited on the second liner layer.

The trench then via process flow advantageously exposes an etch stop layer that forms a protective barrier between the dielectric layer, which may be a low-k dielectric layer, and the first metal layer to merely the via etch, rather than both the via and trench etches. Thus, the etch stop layer is exposed to less etch and strip chemistries. The thickness of the etch stop layer can be reduced in comparison to prior approaches. This significantly reduces the effective dielectric constant value of the film stack and thus reduces interconnect delay.

The process flow also advantageously includes novel liner depositions after the trench and via etches. The liner deposition after the trench etch and prior to via lithography protects the low-k dielectric layer from the via photoresist organic layer operation, moisture, plasma exposure during etch/resist removal, etc. The liner deposition also is used as a hard mask for the via etch to improve uniformity and profile of the vias without needing an additional hard mask layer and strip operation. The liner deposition after the via etch provides a barrier between the metal layers and other materials such as one or more low-k dielectric layers. This liner deposition also electrically couples the first and second metal layers at the bottom of the vias.

The following description provides details of manufacturing machines that process substrates and/or wafers to manufacture devices (e.g., electronic devices, semiconductors, substrates, liquid crystal displays, reticles, microelectromechanical systems (MEMS)). Manufacturing such devices generally requires dozens of manufacturing steps involving different types of manufacturing processes. For example, etching, sputtering, and chemical vapor deposition are three different types of processes, each of which is performed on different chambers or in the same chamber of a machine.

Figure 3:
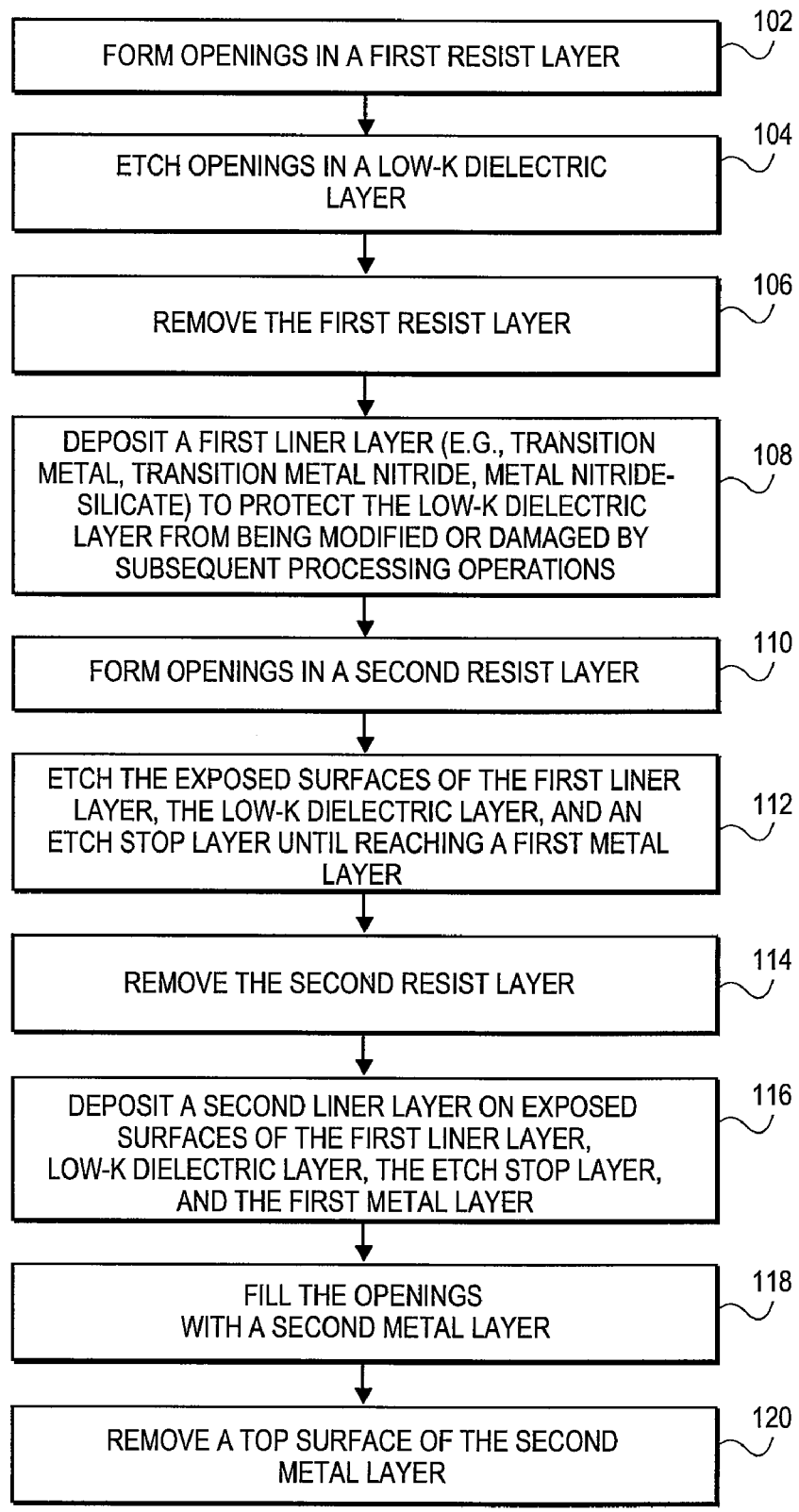
FIG. 3 illustrates one embodiment of a method for fabricating an interconnect structure in accordance with one embodiment.

FIG. 3 illustrates one embodiment of a method for fabricating an interconnect structure. The method includes forming openings in a first resist layer (e.g., photoresist, anti-reflective coating (ARC)) with photolithography operations (block 102). The first resist layer may be disposed on an optional hard mask layer which is disposed on a low-k dielectric layer. The first resist layer may be disposed directly on or above the low-k dielectric layer. Openings in the optional hard mask layer may be formed by wet or dry etching the hard mask layer (e.g., low temperature oxide, organic layer, TEOS). Next, the method includes etching openings in the low-k dielectric layer at block 104. In one embodiment, the low-k dielectric layer is etched to form trenches.

Next, the method includes removing the first resist layer at block 106 with a wet strip or plasma strip operation. Then, the method includes depositing a first liner layer (e.g., transition metal, transition metal nitride, metal nitride-silicate) to protect the low-k dielectric layer from being modified or damaged by subsequent processing operations at block 108. In an embodiment, the first liner layer is deposited on the optional hard mask layer and exposed surfaces of the low-k dielectric layer. Then, the method includes forming openings in a second resist layer (e.g., photoresist, anti-reflective coating (ARC)) at block 110. In one embodiment, the second resist layer is disposed directly on the first liner layer with no intervening hard mask layer because the first liner layer acts as a hard mask layer. Next, the method includes forming additional openings in the low-k dielectric layer by etching the exposed surfaces of the first liner layer, the low-k dielectric layer, and an etch stop layer until reaching a first metal layer at block 112. The low-k dielectric layer may optionally be disposed on the etch stop layer which is disposed on the first metal layer. The etch stop layer (e.g., oxynitride (SiON) based film) provides a barrier between the first metal layer and the low-k dielectric layer. In one embodiment, the first liner layer, low-k dielectric layer, and etch stop layer are etched to form vias that contact the first metal layer with the vias being aligned with the trenches. Then, the method includes removing the second resist layer at block 114. In an embodiment, the second resist layer is removed after the liner etch and before the low-k dielectric layer etch. In another embodiment, the second resist layer is removed after the low-k dielectric layer etch and before the etch stop layer etch. The liner layer acts as a hard masking layer for etching the low-k dielectric layer and the etch stop layer.

Then, the method includes depositing a second liner layer on exposed surfaces of the first liner layer, the low-k dielectric layer, the etch stop layer, and the first metal layer. Then, the method includes filling the openings in the first liner layer, the dielectric layer, and the etch stop layer with a second metal layer at block 118. Lastly, the method includes removing a top surface of the second metal layer at block 120.

In certain embodiments, the second liner layer protects the low-k dielectric layer from moisture and contamination from other layers that may increase the dielectric constant of the low-k dielectric layer or lead to dielectric breakdown issues. The second liner layer also electrically couples the first metal layer to the second metal layer at block 116. The second liner layer has a resistance less than or approximately equal to the resistance of the first liner layer. The second liner layer has a thickness less than or approximately equal to the first liner layer. The first and second liner layers may be the same material or different materials.

In one embodiment, the second metal layer is etched with a chemical-mechanical planarization or chemical-mechanical polishing (CMP) process. This process is used in semiconductor fabrication for planarizing the top surface of an in-process semiconductor wafer or other substrate. In another embodiment, other conventional semiconductor processing occurs in order to etch the metal layer such as a blanket unmasked plasma etch or a masked plasma etch or a combination of conventional semiconductor processing.

In some embodiments, a dual-damascene interconnect structure is fabricated as described above with the porous low-k dielectric layer being etched to form trenches which are aligned above vias which are aligned above the first metal layer. The second metal layer then fills the trenches and vias. The operations of methods in the present disclosure can be performed in a different order, sequence, and/or have more or less operations than described.

Figure 4:
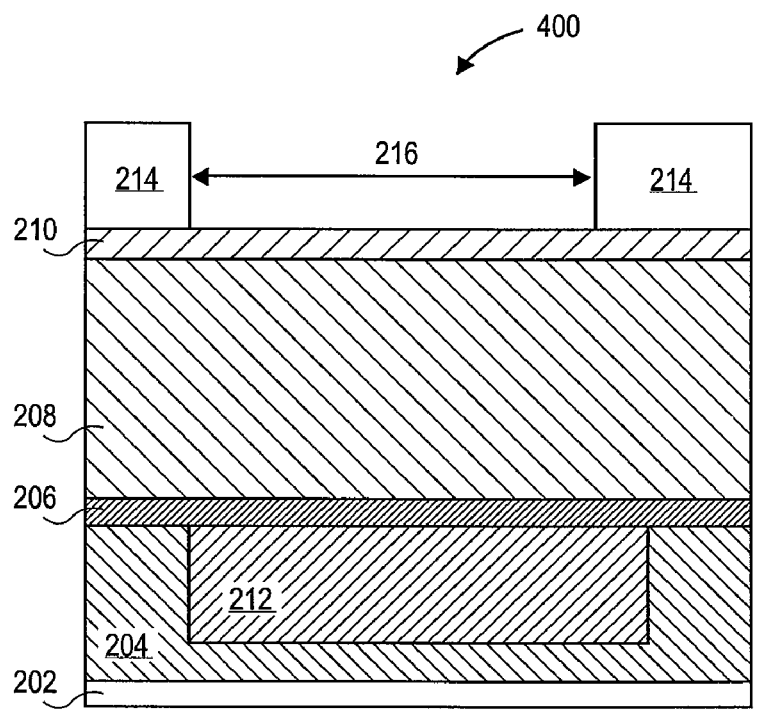
FIG. 4 illustrates a cross-sectional view of an interconnect structure fabricated to form trenches in accordance with one embodiment.

FIG. 4 illustrates a cross-sectional view of an interconnect structure 400 fabricated to form trenches in accordance with one embodiment. The interconnect structure 400 includes a substrate 202, a dielectric layer 204, a metal layer 212, an etch stop layer 206, a porous low-k dielectric layer 208, a masking layer 210 (e.g., low temperature oxide, organic layer, TEOS), and a resist layer 214. In some embodiments, the dielectric layer 204 has a thickness of about 100 nanometers (nm) to about 600 nm and the metal layer 212 has a thickness of about 100 to about 460 nm with a critical dimension of 45 to 200 nm. The etch stop layer 206 has a thickness of about 10 to about 35 nm and may be an oxynitride (SiON) based film, SiC based film, or other type of protective etch stop layer. The masking layer 210 can have a thickness of about 25 to about 50 nm and may be a TEOS film. The photoresist layer 214 has a critical dimension 216 of 40 to 200 nm.

In one embodiment, the low-k dielectric layer 208 has a dielectric constant less than 2.3, a porosity greater than twenty percent, contains greater than ten percent Carbon, and has a thickness of about 100 nm to about 1000 nm. The porous low-k dielectric layer has a density and pores of a certain size (e.g., about 5 to 20 Angstroms). For example, the porous low-k dielectric layer can be a pyrogenic film, a carbon doped oxide, or other type of dielectric layer having a low or ultra low-k.

Figure 5:
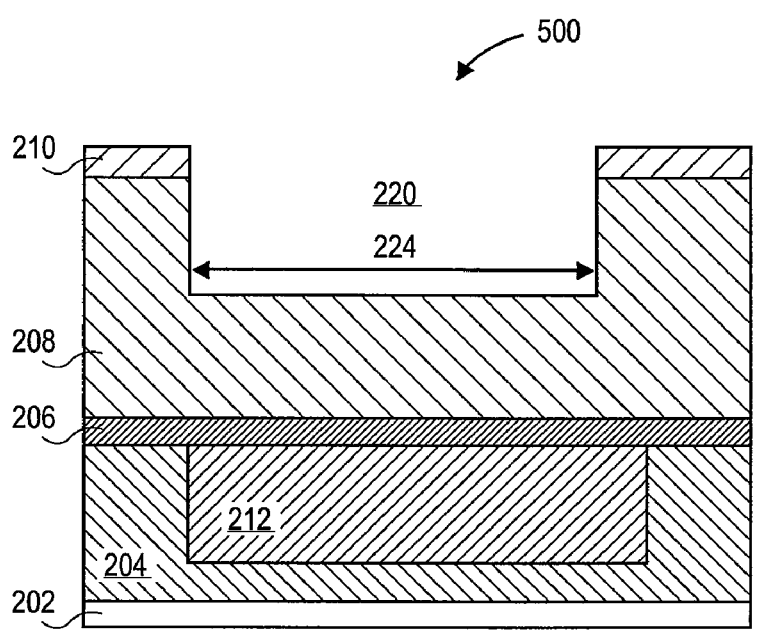
FIG. 5 illustrates a cross-sectional view of an interconnect structure fabricated to form trenches in accordance with another embodiment.

FIG. 5 illustrates a cross-sectional view of an interconnect structure 500 fabricated to form trenches in accordance with another embodiment. The interconnect structure 500 of FIG. 5 illustrates the interconnect structure 400 of FIG. 4 after a trench etch and resist strip that result in the formation of the trench 220 (for example, using method described in FIG. 4). For a photoresist layer 214 having a critical dimension 216 of 40 to 200 nm, the trench 220 has a depth of about 100 to about 460 nm and a critical dimension 224 of 40 nm to 200 nm.

Figure 6:
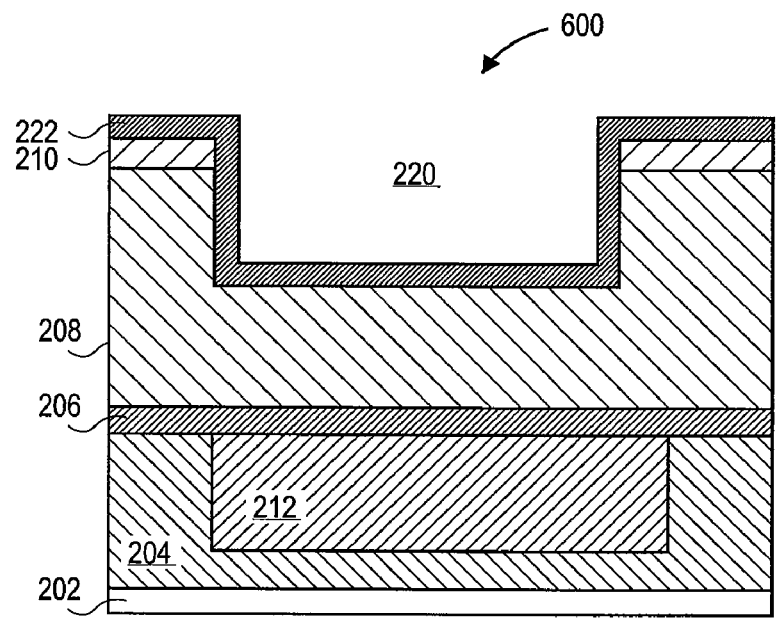
FIG. 6 illustrates a cross-sectional view of an interconnect structure fabricated with a liner layer in accordance with one embodiment.

FIG. 6 illustrates a cross-sectional view of an interconnect structure 600 fabricated with a liner layer in accordance with one embodiment. The interconnect structure 600 includes a first liner layer 222 in addition to the layers illustrated in the interconnect structure 500. The first liner layer 222 is deposited on the first masking layer 210 and exposed surfaces of the porous low-k dielectric layer 208. The first liner layer 222 is a transition metal/metal nitride combination (e.g., Ta, Ti, TaN, TiN, NbN) or metal nitride-silicate that is deposited on exposed surfaces of the masking layer 210 and exposed surfaces of the porous low-k dielectric layer 208. The first liner layer 222 acts as a barrier layer to prevent the efficient diffusion of metals and silicon through this layer, does not react with the interconnecting metal or silicon, is stable during the manufacturing and operation of the device, has a low resistivity (e.g., 200 to 300 micro ohm-centimeters (uohm-cm)), has a good adhesion and protects the underlying material (e.g., low-k dielectric layer 208), and provides good adhesion to a deposited metal layer. The first liner layer 222 may be Ta, $TaN_x$, $WN_x$, $TiSi_xN_y$, $WSi_xN_y$, or $WB_xN_y^5$ in additional to the other types of liner layers discussed above.

In one embodiment, the first liner layer 222 includes a Tantalum/Tantalum Nitride film to protect the porous low-k dielectric layer 208 from being modified or damaged by subsequent processing operations. The first liner layer 222 has a thickness of about 3 nm to about 10 nm. The first liner layer 222 is designed to be thick enough to prevent Copper or other potential contaminants from diffusing from metal layers into other materials such as the low-k dielectric layer 208 but yet thin enough to maintain and not appreciably decrease the trench diameter and/or critical dimension 224.

Figure 7:
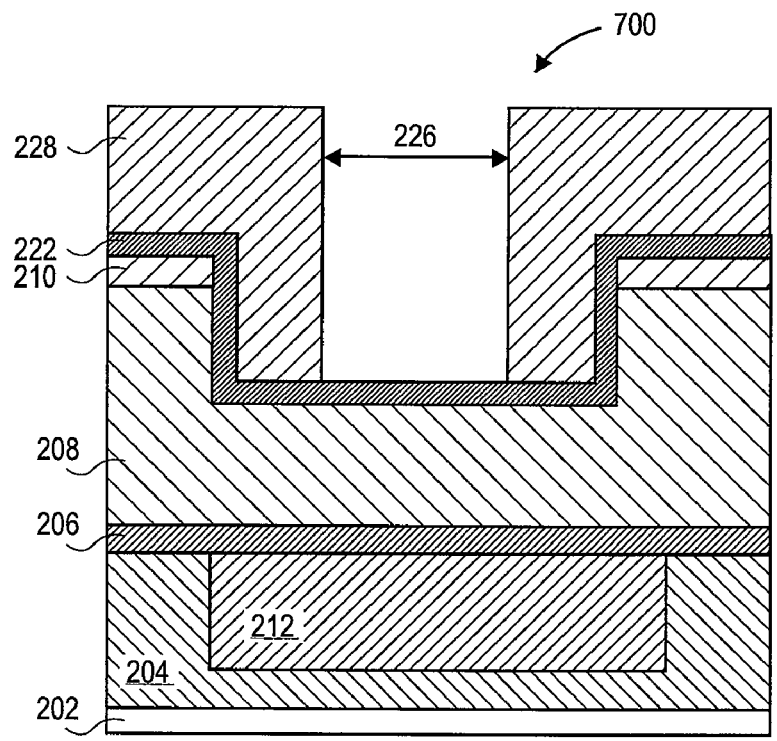
FIG. 7 illustrates a cross-sectional view of an interconnect structure fabricated to form vias in accordance with one embodiment.

FIG. 7 illustrates a cross-sectional view of an interconnect structure 700 fabricated to form vias in accordance with another embodiment. The interconnect structure 700 of FIG. 7 illustrates the interconnect structure 600 of FIG. 6 after standard photolithography operations that result in the formation of the opening 226 in a photoresist layer 228. For example, the resist layer 228 is patterned with a via mask, exposed to a light source, and the exposed or unexposed portions of the photoresist are dissolved with a photoresist developer to form via openings 226 in the resist layer 228. Vias can be formed without the trench operations illustrated in FIGS. 4-6.

Figure 8:
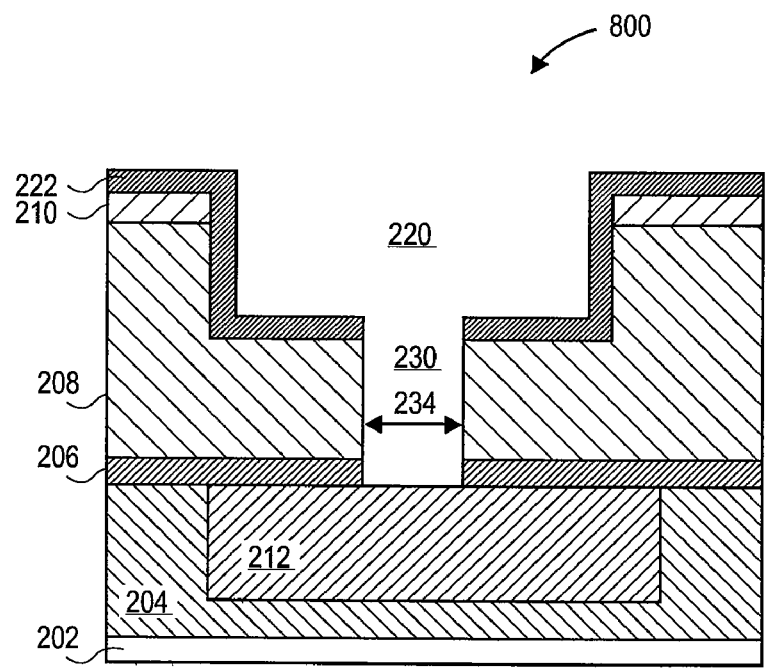
FIG. 8 illustrates a cross-sectional view of an interconnect structure fabricated to form vias in accordance with another embodiment.
Figure 12:
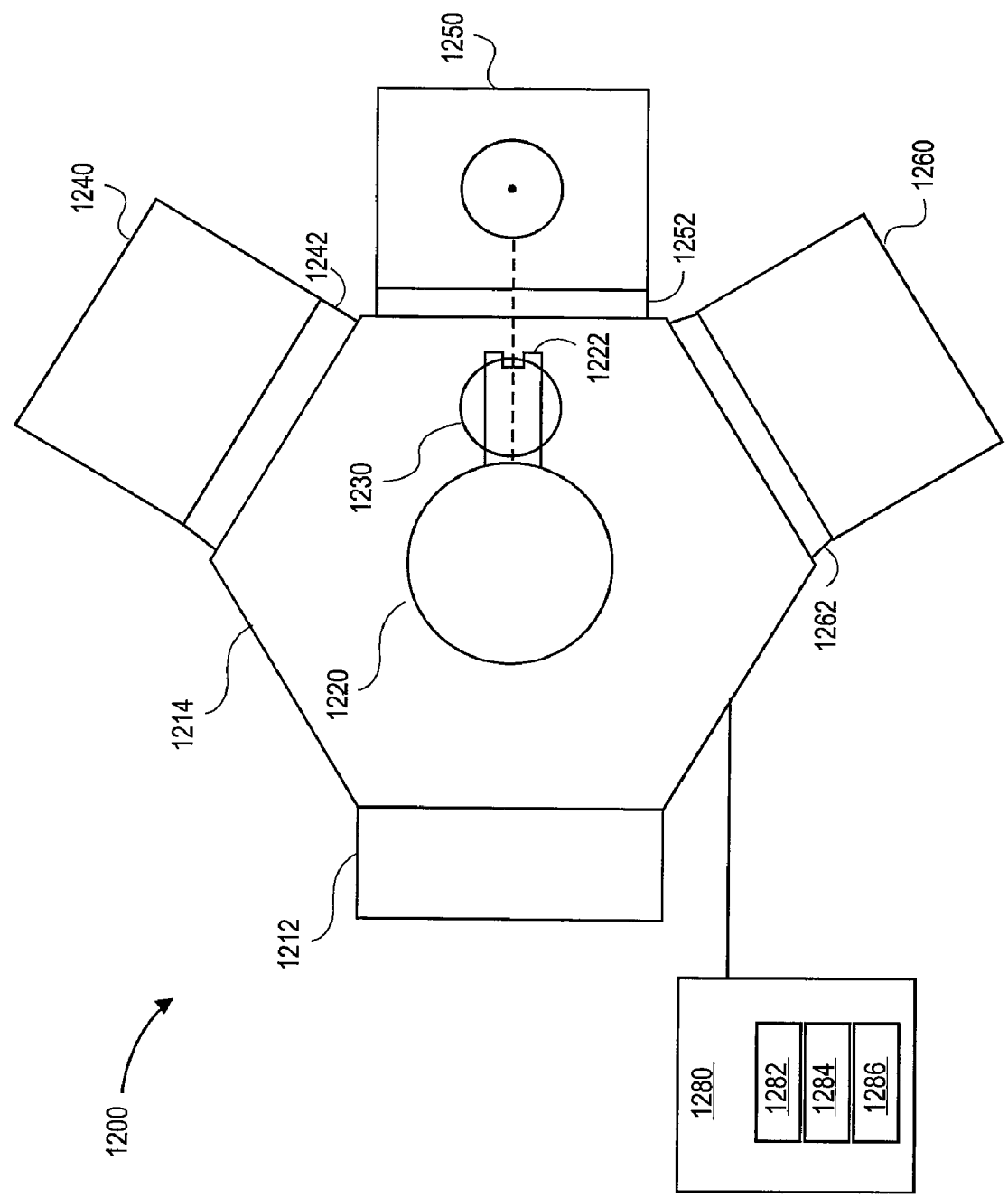
FIG. 12 illustrates a block diagram of a manufacturing machine in accordance with one embodiment.

FIG. 8 illustrates a cross-sectional view of an interconnect structure 800 fabricated to form vias in accordance with another embodiment. The interconnect structure 800 of FIG. 8 illustrates the interconnect structure 700 of FIG. 7 after one or more etch operations that result in the formation of the via 230. The first liner layer 222, the low-k dielectric layer 208, and the etch stop layer 206 are etched in one or more chambers of a manufacturing machine that is illustrated in FIG. 12. The photoresist layer 228 is then stripped or ashed resulting in the interconnect structure 800.

In an embodiment, the photoresist layer 228 is removed after the liner etch and before the low-k dielectric layer etch. In another embodiment, the photoresist layer 228 is removed after the low-k dielectric layer etch and before the etch stop layer etch. The first liner layer 222 acts as a hard masking layer for etching the low-k dielectric layer 208 and the etch stop layer 206.

In one embodiment, the via 230 has a depth of about 50 nm to about 200 nm and a critical dimension 234 of about 30 nm to about 200 nm.

The first liner layer 222 protects the low-k dielectric layer 208 from the photoresist organic layer 228, moisture, plasma exposure during etch/resist removal, etc. The first liner layer 222 also is used as a hard mask for the via etch to improve uniformity and profile of the vias without needing an additional hard mask layer and strip operation.

Figure 9:
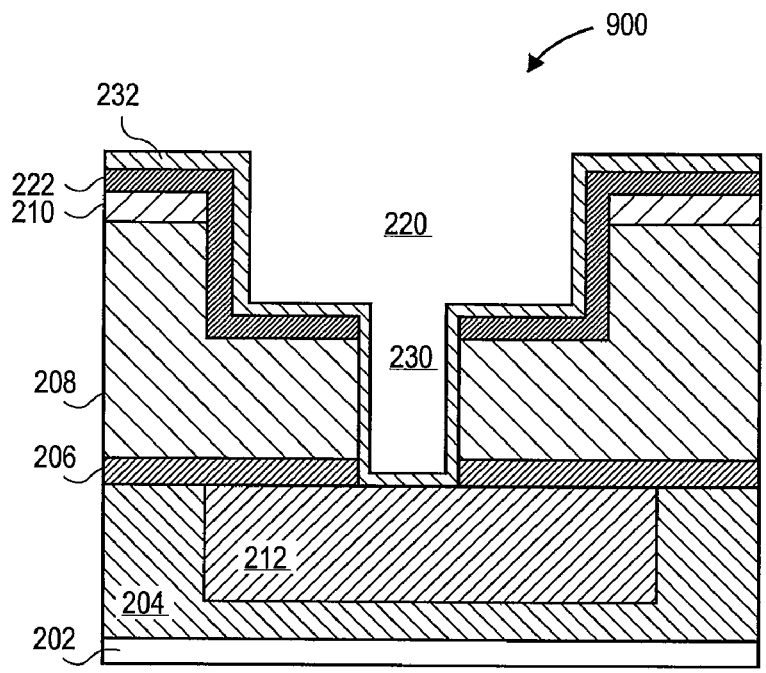
FIG. 9 illustrates a cross-sectional view of an interconnect structure fabricated with a liner layer in accordance with another embodiment.

FIG. 9 illustrates a cross-sectional view of an interconnect structure 900 fabricated with a liner layer in accordance with another embodiment. The interconnect structure 900 includes a second liner layer 232 in addition to the layers illustrated in the interconnect structure 800. The second liner layer 232 is a transition metal nitride (e.g., TaN, TiN, NbN) or metal nitride-silicate that is deposited on exposed surfaces of the first liner layer 222, exposed surfaces of the porous low-k dielectric layer 208, exposed surfaces of the etch stop layer 206, and exposed surfaces of the first metal layer 212. The second liner layer 232 acts as a barrier layer to prevent the efficient diffusion of metals and silicon through this layer, does not react with the interconnecting metal or silicon, is stable during the manufacturing and operation of the device, has low resistivity (e.g., 80 to 200 uohm-cm) for contacting the underlying material (e.g., metal layer), has good adhesion to the underlying material, and provides good adhesion to a deposited metal layer. The second liner layer 232 may be Ta, $TaN_x$, $WN_x$, $TiSi_xN_y$, $WSi_xN_y$, or $WB_xN_y^5$. In one embodiment, the second liner layer 232 includes a Tantalum Nitride film to protect the porous low-k dielectric layer 208 from being modified or damaged by subsequent processing operations.

In one embodiment, the second liner layer 232 has a thickness of about 2 nm to about 5 nm. The second liner layer 232 is designed to be thick enough to prevent Copper or other contaminants from diffusing from metal layers into other materials such as the low-k dielectric layer 208 but yet thin enough to maintain and not appreciably decrease the via diameter and critical dimension 234. The second liner layer 232 needs to a have a low resistivity (e.g., 80 to 200 uohm-cm) for contacting the underlying material (e.g., metal layer).

Figure 10:
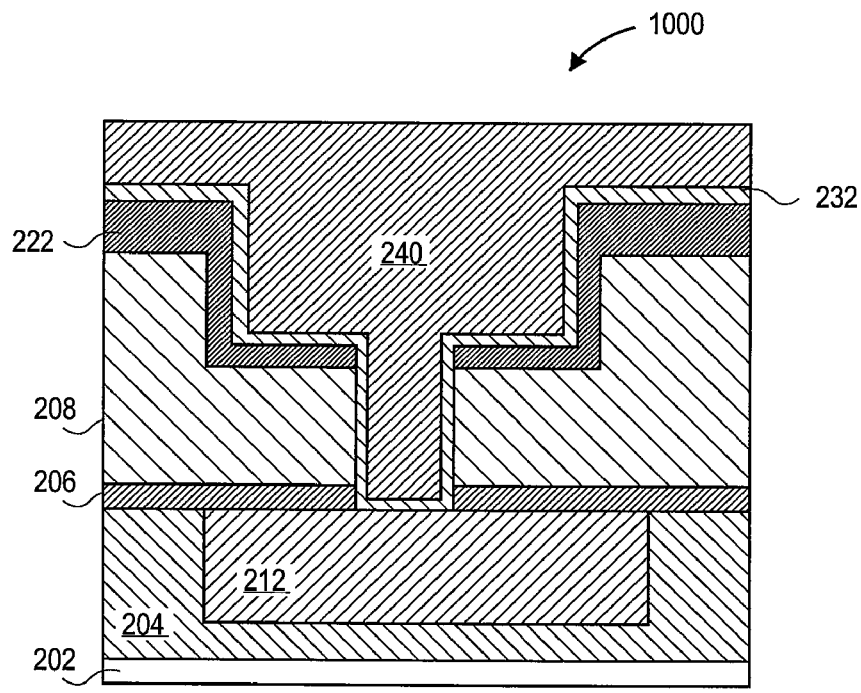
FIG. 10 illustrates a cross-sectional view of a dual-damascene interconnect structure fabricated in accordance with one embodiment.

FIG. 10 illustrates a cross-sectional view of a dual-damascene interconnect structure 1000 fabricated in accordance with another embodiment. The interconnect structure 1000 includes a second metal layer 240 in addition to the layers illustrated in the interconnect structure 900. The second metal layer 240 may be deposited or plated onto the interconnect structure 1000 to fill the vias and trenches.

Figure 11:
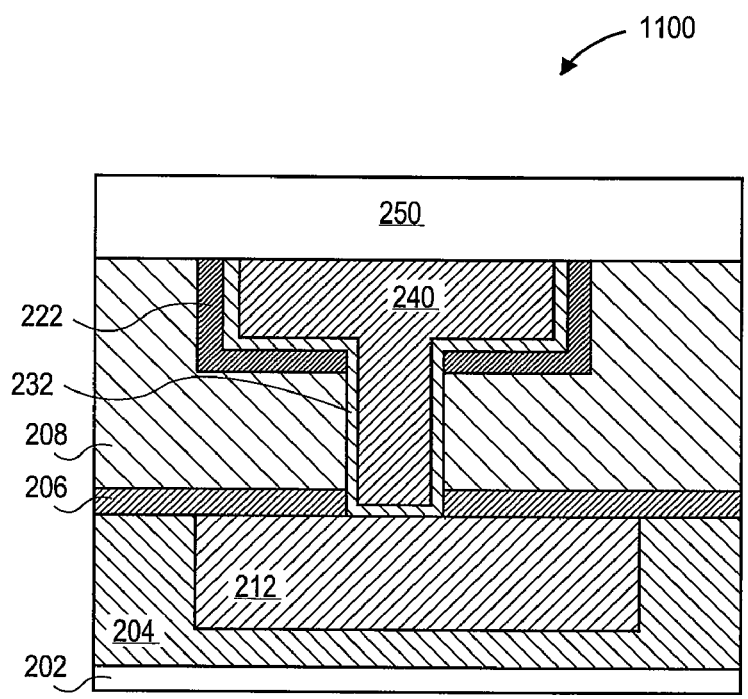
FIG. 11 illustrates a cross-sectional view of a dual-damascene interconnect structure fabricated in accordance with another embodiment.

FIG. 11 illustrates a cross-sectional view of a dual-damascene interconnect structure fabricated in accordance with another embodiment. A top surface of the metal layer 240 is removed with standard semiconductor processing. In one embodiment, a chemical-mechanical planarization process etches the top surface of the metal layer 240 disposed on the interconnect structure 1100. The metal layer 240 is etched to a certain thickness, until reaching the masking layer 210, or until reaching the porous dielectric layer 208 resulting in the interconnect structure 1100. The masking layer 210, first liner layer 222, and second liner layer 232 each have a higher dielectric constant in comparison to the porous dielectric layer 208. These layer(s) may be completely removed in order to minimize the dielectric constant of the interconnect structure 1000. The at least one via 230 and at least one trench 220 have been filled with the metal layer 240 (e.g., Cu plating, AlCu deposition). A dielectric layer 250 may then be deposited on top of the metal layer 240.

The second liner layer 232 may be designed to optimize Copper growth in the vias during the deposition of the metal layer 240. This second liner layer 232 could be more fragile because the portion of the second liner layer 232 in the vias that is the only or primary protective layer for the low-k dielectric layer 208 adjacent to the vias is not exposed to the chemical-mechanical planarization.

In some embodiments, dual-damascene interconnect structures are formed as illustrated in FIGS. 4-11 with a trench then via process flow. The first liner layer 222 and second liner layer 232 may be the same material or different materials having different properties with the second liner layer 232 being formed on the first liner layer 222. The first liner layer 222 may include Tantalum Nitride and Tantalum based films for protecting the dielectric layer 208. The first liner layer 222 may have a low resistivity (e.g., 200 to 300 uohm-cm). The second liner layer 232 may include a Tantalum Nitride based film for protecting the low-k dielectric layer and simultaneously electrically coupling the first metal layer 212 and the second metal layer 240. The second liner layer 232 may have a low resistivity (e.g., 80 to 200 uohm-cm) for contacting the underlying material (e.g., metal layer). The second liner layer 232 may also be designed to optimize Copper growth in the vias during a subsequent metal deposition operation.

In one embodiment, the thickness of the first liner layer 222 is greater than the thickness of the second liner layer 232 and the resistance of the first liner layer 222 is greater than the resistance of the second liner layer 232. The first liner layer 222 is thick enough to be protect the dielectric layer 208 and function as a hard mask for the via etch while thin enough to not appreciably reduce the critical dimension of the trench opening. The first liner layer may be deposited with physical vapor deposition (PVD) such as sputter deposition or with chemical vapor deposition (CVD). The second liner layer 222 is thick enough to protect the dielectric layer 208 while thin enough to not appreciably reduce the critical dimension of the via opening and also provide a low resistance path between the first metal layer 212 and the second metal layer 240. The second liner layer may be deposited with PVD or CVD as well.

The process flow advantageously exposes the etch stop layer 206 to merely the via etch, rather than both the via and trench etches. Thus, the etch stop layer 206 is exposed to less etch and strip chemistries. The thickness of the etch stop layer 206 can be reduced in comparison to prior approaches. In one embodiment, the thickness of the etch stop layer 206 is 10 to 35 nm and may be an oxynitride (SiON) based film. This significantly reduces the effective dielectric constant value of the film stack and thus reduces interconnect delay.

The process flow also advantageously reduces the depth/height of the via etch because the significantly wider trench has already been etched. A planarizing operation such as an organic planarizing deposition and subsequent strip is then not necessary prior to the via photolithography operation. This via operation typically has minimum critical dimensions, reflective underlying materials, and potential photolithography/etch issues because of variations in topology across a wafer. The novel process flow reduces these issues by having the via etched after the trench. As a result, the via size and profile is more uniform across a wafer die and wafer.

Eliminating an organic planarizing layer deposition results in more repeatable performance based on eliminating the exposure of the low-k dielectric layer to the organic planarizing layer. Reducing the number of processing operations lowers material costs and improves throughput.

The novel process flow also reduces the exposure of a metal etch stop layer (e.g., Copper etch stop layer) disposed on a metal layer until the via etch, which occurs at the end of the dual-damascene process flow.

In one embodiment, the interconnect structures described herein illustrate a dual-damascene process having at least one via 230 and at least one trench 220 formed from semiconductor deposition, lithography, etch, strip, and planarization operations. Dual-damascene forms studs and interconnects with one metallization operation. The dual-damascene process increases the density, performance, and reliability in a fully integrated wiring technology. In another embodiment, the interconnect structures are a single damascene structure or other structure that forms an opening in a porous dielectric layer.

The interconnect structures can be fabricating with the manufacturing machine 1200 described herein which is suitable for processing substrates such as semiconductor substrates 202, and may be adapted by those of ordinary skill to process other substrates such as flat panel displays, polymer panels or other electrical circuit receiving structures. Thus, the manufacturing machine 1200 should not be used to limit the scope of the invention, nor its equivalents, to the exemplary embodiments provided herein.

FIG. 12 illustrates one embodiment of a manufacturing machine. The manufacturing machine 1200 (e.g., process cluster tool) includes a controller 1280 that includes a processing unit 1282, software program 1284, and memory 1286. In one embodiment, the manufacturing machine 1200 includes a loading station 1212, a transfer chamber 1214, and chamber ports 1242, 1252, and 1262 associated with processing chambers 1240, 1250, and 1260. The number of processing chamber(s) associated with the transfer chamber can vary. The transfer chamber 1214 includes a robot 1220, a robot blade 1222, and a substrate 1230. The transfer chamber 1214 is typically held under pressure. Data may be transmitted between the transfer chamber 1214, process chambers 1240, 1250, and 1260, substrate 1230, and controller 1280 in a raw or processed format. The robot 1220 transfers devices (e.g., semiconductor wafers, substrates, liquid crystal displays, reticles) between the load station 1212 and the processing chambers.

The machine 1200 may be operated by the controller 1280 that sends instructions via a hardware interface to operate the chamber components, for example, a substrate support, a gas distributor, a gas energizer and a gas exhaust. The process conditions and parameters measured by the different detectors in the chambers are sent as feedback signals by control devices such as gas flow control valves, pressure monitor, throttle valve, and other such devices, and are transmitted as electrical signals to the controller 1280. Although, the controller 1280 is illustrated by way of an exemplary single controller device to simplify the description of present invention, it should be understood that the controller 1280 may be a plurality of controller devices that may be connected to one another or a plurality of controller devices that may be connected to different components of the chambers. Thus, the present invention should not be limited to the illustrative and exemplary embodiments described herein.

The controller 1280 includes electronic hardware including electrical circuitry including integrated circuits that are suitable for operating the chambers and its peripheral components. Generally, the controller 1280 is adapted to accept data input, run algorithms, produce useful output signals, detect data signals from the detectors and other chamber components, and to monitor or control the process conditions in the chambers. For example, the controller 1280 may be a computer including (i) a central processing unit (CPU) 1282, such as for example, a conventional microprocessor, that is coupled to the memory 1286 that includes a removable storage medium, such as for example a CD or floppy drive, a non-removable storage medium, such as for example a hard drive or ROM, and RAM; (ii) application specific integrated circuits (ASICs) that are designed and preprogrammed for particular tasks, such as retrieval of data and other information from the chambers, or operation of particular chamber components; and (iii) interface boards that are used in specific signal processing tasks, including, for example, analog and digital input and output boards, communication interface boards and motor controller boards. The controller interface boards, may for example, process a signal from a process monitor and provide a data signal to the CPU. The computer also has support circuitry that include for example, co-processors, clock circuits, cache, power supplies and other well known components that are in communication with the CPU. The RAM can be used to store the software implementation of the present invention during process implementation. The instruction sets of code are typically stored in storage mediums and are recalled for temporary storage in RAM when being executed by the CPU.

In one embodiment, the controller 1280 includes a software program 1284 that is readable by the computer and may be stored in the memory 1286, for example on the non-removable storage medium or on the removable storage medium. The software program 1284 generally includes process control software including program code including instructions to operate the chambers and its components for various process operations (e.g., thin film deposition, sputtering, etch, metallization), process monitoring software to monitor the processes being performed in the chambers, safety systems software, and other control software. For example, the software program 1284 may include program code for operating process chamber to perform a via etch, a trench etch, a liner deposition, metal deposition, etc. Suitable program code is entered into a single file, or multiple files, using a conventional text editor and stored or embodied in computer-usable medium of the memory. If the entered code text is in a high level language, the code is compiled, and the resultant compiler code is then linked with an object code of pre-compiled library routines. To execute the linked, compiled object code, the user invokes the object code, causing the CPU to read and execute the code to perform the tasks identified in the program.

In some embodiments, the controller 1280 is operatively coupled to the process chambers. The controller 1280 includes the software program 184 to operate the process chambers for various deposition, sputter, plating, and etch operations of the present invention described.

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of fabricating a dual-damascene interconnect structure, comprising:
   forming openings in a first resist layer disposed above a low dielectric constant (low-k) dielectric layer;
   etching openings in the low-k dielectric layer;
   depositing a first liner layer to protect the low-k dielectric layer;
   forming openings in a second resist layer;
   etching additional openings in the low-k dielectric layer that is disposed on an etch stop layer;
   etching openings in the etch stop layer disposed on a first metal layer;

depositing a second liner layer to protect the low-k dielectric layer;

removing the first resist layer prior to depositing the first liner layer;

removing the second resist layer prior to depositing the second liner layer; and depositing a second metal layer on the second liner layer.

2. The method of claim 1, wherein the second liner layer is deposited on the first liner layer, exposed surfaces of the low-k dielectric layer, exposed surfaces of the etch stop layer, and exposed surfaces of the first metal layer.

3. The method of claim 1, wherein the etch stop layer has a thickness approximately between 8 nanometers (nm) and 35 nm.

4. The method of claim 1, wherein the first liner layer has a thickness approximately between 3 nm and 10 nm and the second liner layer has a thickness approximately between 2 nm and 5 nm.

5. The method of claim 1, wherein the first liner layer has a resistance greater than or approximately equal to a resistance of the second liner layer.

6. The method of claim 1, wherein the etch stop layer comprises an oxynitride (SiON) based film to form a protective interface between the first metal layer and the low-k dielectric layer.

* * * * *